United States Patent [19]

Corwin

[11] Patent Number: 4,674,811
[45] Date of Patent: Jun. 23, 1987

[54] APPARATUS FOR CONNECTING PIN GRID ARRAY DEVICES TO PRINTED WIRING BOARDS

[75] Inventor: Rudolph E. Corwin, Seattle, Wash.

[73] Assignee: Honeywell Inc., Minneapolis, Minn.

[21] Appl. No.: 883,954

[22] Filed: Jul. 10, 1986

[51] Int. Cl.$^4$ .......................................... H01R 13/631
[52] U.S. Cl. ...................................... 439/69; 439/329; 439/660; 439/259
[58] Field of Search ............. 339/17 CF, 74 R, 75 M, 339/176 M

[56] References Cited

U.S. PATENT DOCUMENTS

| | | | |
|---|---|---|---|
| 4,420,205 | 12/1983 | Kirkman | 339/176 M |
| 4,505,532 | 3/1985 | Hine et al. | 339/17 CF |
| 4,519,660 | 5/1985 | Ichimura et al. | 339/17 CF |

OTHER PUBLICATIONS

IBM Technical Disclosure Bulletin, vol. 13, No. 5, 10/1970, "Insertion/Extraction Test Socket", Bruder.

*Primary Examiner*—John McQuade
*Attorney, Agent, or Firm*—Orrin M. Haugen; Thomas J. Nikolai; Frederick W. Niebuhr

[57] ABSTRACT

A zero insertion force connector for electrically and mechanically connecting the terminal pins of a pin grid array semiconductor device to corresponding terminal pins on a printed wiring board. The connector includes first and second identically molded plastic substrates, each having a grid pattern of apertures therethrough where the grid corresponds to the spacing of the terminal pins on the pin grid array semiconductor device. Formed proximate one end of each of the rectangular apertures is a rectangular post which projects outwardly from a major surface of the substrate and which has a height approximately equal to the thickness dimension of the substrate, such that when the first substrate is inverted relative to the second substrate, the projecting posts of one will fit into the rectangular apertures of the other. The posts are dimensioned relative to the size of the rectangular apertures such that an opening exists into which both the terminal pins on the pin grid array device and the spring pins on the printed wiring board can simultaneously fit into these openings. Completing the assembly is a frame which is made to surround the two substrates and which has an adjustment feature for clamping the edges of the substrates. When so clamped, the first substrate is moved laterally relative to the second substrate, thereby squeezing the mating terminals of the printed circuit board and pin grid array together between the projecting posts of the two substrates.

3 Claims, 6 Drawing Figures

APPARATUS FOR CONNECTING PIN GRID ARRAY DEVICES TO PRINTED WIRING BOARDS

BACKGROUND OF THE INVENTION

I. Field of the invention

This invention relates generally to electrical connector devices, and more particularly to the design of a zero insertion force connector especially adapted for joining the terminal pins of pin grid array semiconductor devices to mating spring pins on a printed wiring board.

II. Discussion of the Prior Art

In the past, a common packaging arrangement for integrated circuits has been the so-called dual inline package (DIP) in which the active semiconductor devices are encased in a housing having a generally rectangular configuration with leads exiting the opposed longitudinal edges in an aligned row of pins. When electrically connecting such IC packages to other circuit components via a printed wiring board, the practice has been to either position the IC directly on the printed circuit board with its dual inline terminals directly entering correspondingly aligned plated-through holes on the printed circuit board and held in place in a wave soldering operation or to first install an integrated circuit socket onto the board and then plugging the terminals of the IC device into the socket. Each of the above approaches has been found to be workable when the number of terminal pins involved is less than 40, which is typical for LSI technology.

With the advent of very large scale integrated circuit technology (VLSI), a substantially increased number of active devices are included on a single VLSI chip and, accordingly, a need exists for an increased number of terminal pins so that electrical signals and power can be interfaced with the device. To keep the speed of the circuit high, short path lengths on the device are necessary. One approach in obtaining an increased number of pin-outs and short path lengths has been to encase the VLSI chip in a generally square housing whose dimensions are typically 1.1"×1.1" for a 12×12 pin array and then having a plurality of terminal pins exiting the base of the package rather than its side edges, the pins being arranged in a grid-like pattern of uniformly spaced rows and columns. Typically, such a VLSI pin grid array (PGA) package may include in excess of 100 such pins laid out in a grid pattern on 0.100 inch centers.

While IC sockets have proved workable for DIP packages having comparatively few pin-out terminals, the same approach cannot effectively be used for PGA devices because of the high insertion forces associated with that large number of terminal pins to be accommodated. Similarly, direct insertion of PGA device terminal pins directly into a matching pattern of plated-through holes on the printed circuit board creates significant problems in inspecting and correcting any soldering faults that may arise during the wave soldering operation used to join the device to the associated PC board. The same is true for the normal PGA socket mounted directly on the board. Because the device or socket necessarily must rest directly upon the surface of the PC board with the terminal pins being soldered into the grid pattern of plated-through holes on the PC board, it is practically impossible to effectively visually inspect each of the connections on both sidese of the board to ensure that a good solder joint has been created and that the board surfaces have been effectively cleaned to remove any corrosive soldering flux that might later lead to a fault. Furthermore, it is not possible using this technique to obtain a conformal coating on both sides of the board about the terminal pins following their insertion into the printed board for electrically insulating the closely spaced terminal pins from one another.

It should be pointed out that the prior art does contain one technique which overcomes the above difficulties. This technique is the use of individual pin sockets separately installed in the individual plated-thru-holes. Such pin sockets come in two forms, each of which is subject to certain restrictions which limits their use in high density packaging. The first type consists of a large diameter socket body (typically greater than 0.050 inch diameter) which sits above the board surface. Appended to the bottom of the socket portion is a smaller diameter solder tail (typically 0.020 inch diameter—comparable to the diameter of the PGA device pins). The solder tail is soldered into the plated-thru-hole and the socket body sits above the board. This form of pin socket has the advantage of requiring only a normal sized plated-thru-hole, thus allowing space between holes for routing traces on the various layers of the laminated printed wiring board, but it has the major disadvantage of adding considerably to the vertical height above the board (typically increasing the component height by 0.200 to 0.250 inch). The latter disadvantage frequently obviates the use of such pin sockets in high density electronic packaging where desired low board-to-board spacing restricts the maximum component height which may be accommodated.

The second type of pin socket consists only of the large diameter socket portion which is inserted totally into large diameter plated-thru-holes. This construction adds little to component height (typically only a 0.020 inch flange sits above the board), but the large diameter plated-thru-hole severely restricts the space left between holes for routing traces. Thus, this design cannot be used for PGA devices where multiple traces between holes are frequently necessary. This is particularly the case in high reliability circuits where the design rules governing hole size tolerances and trace width tolerances are more restrictive.

In addition to the above-mentioned problems associated with directly joining a PGA device to a printed wiring board, a further significant problem exists when it is determined that there has been a solder defect and it becomes necessary to repair the board prior to its use. Those skilled in the art will recognize that, when using VLSI, it is necessary to also use multi-layer printed circuit boards to accommodate the necessary number of interconnects between the ICs and other components that may populate the PC board. These multi-layer PC boards commonly include one or more ground planes which tend to be generally continuous layers of un-etched copper. Still other layers include patterns of fine printed wiring joining small terminal pad areas to one another. When the foregoing is considered, it becomes readily apparent that significant differences exist in the thermal capacity of each of the plated-through holes and, hence, the problem of unsoldering such a large number of terminal pins from the plated-through holes becomes very difficult and often results in the need to totally scrap the entire board. Naturally, depending upon the complexity of the active and passive devices populating the board, this can be exceedingly costly.

While many of the desirable features of this prevent invention are available separately in other devices, the features are normally mutually exclusive, e.g., zero insertion force sockets have high "real estate", that is, board area requirements and add considerably to component height. The present invention is unique in that such features as zero insertion force, high retention force, low "real estate" requirement, low additional component height, normal plated-thru-hole size requirement, complete removability from the board permitting cleaning, inspection and conformal coating plus individual solder joint repair or individual pin replacement, as well as low parts cost and low non-recurring tooling costs are all present in a single device.

The device of the present invention obviates all of the foregoing problems. More particularly, it provides an inexpensive device for joining PGA devices to PC boards while allowing inspection of the solder joints on both sides of the board and the necessary access whereby the board can be cleaned free of contaminants following the wave soldering operation. In addition, the connector device of the present invention permits the application of conformal coatings and exhibits zero insertion force or very low insertion force characteristics. The connector of the present invention also does not waste "real estate" on the PC board to the extent that other prior art zero insertion force sockets are likely to do.

Of particular importance is the fact that the device of the present invention adds very little to the vertical dimension of the mounted component, i.e., the total component height increase can be held to less than 0.100 inch. As already mentioned, this feature is significant, particularly in high density packaging because the close board spacing severely limits maximum component height.

SUMMARY OF THE INVENTION

In accordance with the present invention, there is first provided a plurality of conductive pins having an integrally formed leaf spring segment thereon, the conductive pins being inserted into a grid pattern of plated-through holes on the printed circuit board. Thus, once the grid pattern of pins is soldered in place, the joints on both sides of the board remain viewable and the surfaces are accessible to permit cleaning and a conformal coating material to be applied to the board and the outwardly projecting spring pins. To mate the spring pins with the corresponding terminal pins of the PGA device, there is provided a pair of flat plastic plates or substrates each having a pattern of rectangular apertures formed through the thickness dimension of the plates and each having an outwardly projecting rectangular post formed at one end of each of the aforementioned apertures. The height of the posts are generally the same as the thickness dimension of the plate or substrate and, when one such substrate is inverted and juxtaposed upon the other, the posts of one fit into the apertures of the other while still leaving a space between adjacent posts. This space allows the juxtaposed plates to be fitted over the spring pins on the printed circuit board and, at the same time, the terminal pins of the pin grid array device can fit into the same openings. In the juxtaposed position when the spacing between the posts is in a maximum open position, the front and back edges of the two substrates are misaligned or slightly overlapping. Then, a clamping assembly is positioned about the perimeter of the juxtaposed substrates and, when the clamping assembly is tightened down, the juxtaposed substrates slide laterally with respect to one another (owing to the clamp forcing the front and back edges of the top and bottom substrates into alignment) causing surfaces on the posts to squeeze the spring pins securely against the terminal pins of the PGA device, insuring good electrical continuity and mechanical attachment.

OBJECTS

It is a principal object of the present invention to provide an improved device for effectively connecting a pin grid array device to a printed wiring board.

Another object of the invention is to provide a zero insertion force connector for releasably coupling a PGA device to matching terminals on a printed circuit board.

Still another object of the invention is to provide a means for attaching a PGA device to a printed circuit board which still permits cleaning and a full inspection of the integrity of solder connections.

Yet a further object of the invention is to provide a connector device for joining a PGA integrated circuit package to a printed circuit board while still allowing a conformal coating to be applied to the printed circuit board and to the pins used to join the printed wiring pattern on the board to predetermined terminals of the PGA device.

Another object of the invention is to achieve a high clamping force such that a "gas tight" or hermetic connection is made to insure corrosion resistance and such that the reliability of said connection will not be impaired in high shock or vibration environments.

Still another object of the invention is to accomplish all of the above objects while adding only a modest increase in the total additional vertical height above the board, e.g., 0.100 inch or less.

These and other objects and advantages of the invention will become apparent to those skilled in the art from the following detailed description of a preferred embodiment, especially when considered in conjunction with the accompanying drawings in which like numerals in the several views refer to corresponding parts.

DESCRIPTION OF THE PREFERRED EMBODIMENT

Figure 1:
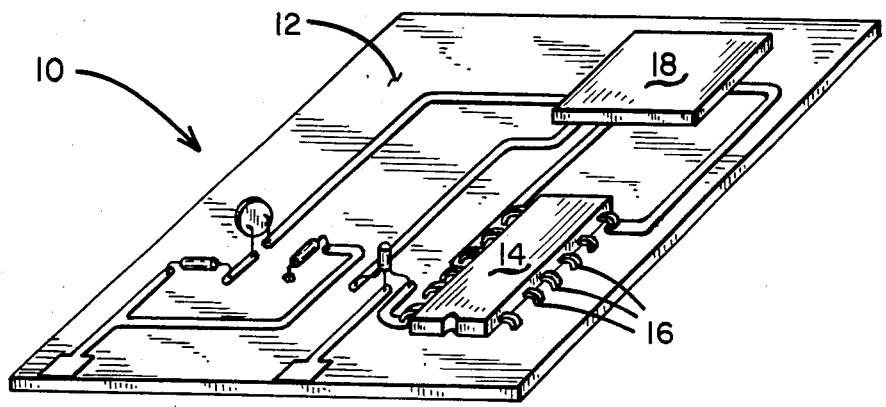
FIG. 1 is a perspective view of a prior art printed circuit board supporting a PGA integrated circuit device.

Referring to FIG. 1, there is shown a prior art electronic module indicated generally by numeral 10 and which includes a multi-level printed wiring board 12 having a plurality of electrical components including an integrated circuit chip 14 of the dual in-line package (DIP) type bonded to the board as by soldering or the like. More particularly, each of the leads 16 are fitted into plated-through holes formed in the multi-layer board 12 and held in place by solder (not shown). As is well known in the art, in a multi-layer printed circuit configuration, printed wiring may be formed on any of the various laminated substrates comprising the board 12 and the pattern of wiring on one or more levels can be joined together using a plated-through hole technique.

Also shown in the typical prior art configuration of FIG. 1 is an integrated circuit device referred to as a pin grid array device and which is identified by numeral 18. As earlier indicated, a pin grid array package is required where very large scale integrated circuit chips of a complex nature are involved. Rather than having the terminal pins emanating from opposed side edges of the chip, in a pin grid array the terminal pins project from the bottom major surface of the generally square package and are arranged in rows and columns to form a grid. The terminal pins may be on 100 mil centers, and using this technique, it is possible to obtain, typically 144 external connection points to the VLSI device 18. The terminal pins of the PGA device 18 extend from the bottom surface and are, therefore, not visible in the drawing of FIG. 1. Located beneath the chip 18 on the PC board 12 is a grid pattern of plated-through holes into which the pins from the device 18 are inserted as the board 12 is populated with components and prior to the usual wave soldering step.

With continued attention to FIG. 1, it becomes immediately apparent that, because of the fact that the chip 18 either rests upon the upper surface of the board 12 or is spaced only slightly from that surface, it becomes almost impossible to visually inspect the integrity of the large number of connections between the plated-through holes and the pins of the PGA device 18 from the component side of the board. Furthermore, the close spacing generally precludes a thorough cleaning of the board following the soldering operation and, hence, it is possible that corrosive soldering flux may remain on the board beneath the device 18. Finally, the close spacing between the bottom of the device 18 and the printed circuit board 12 to which it is connected precludes the formation of a conformal coating of insulating material about the terminal pins which leaves the resulting circuit assembly of FIG. 1 more susceptible to failure due to short circuits or the like.

Figure 4:
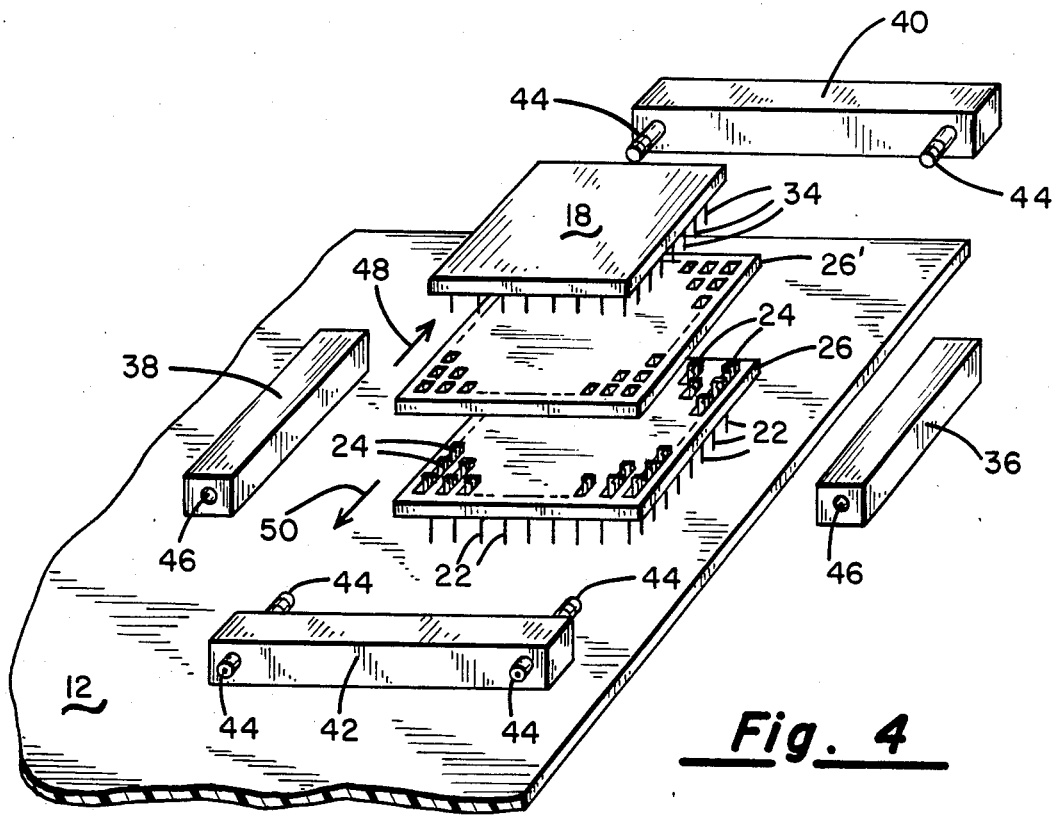
FIG. 4 is a perspective, blown-apart view illustrating the connector of the present invention.
Figure 2:
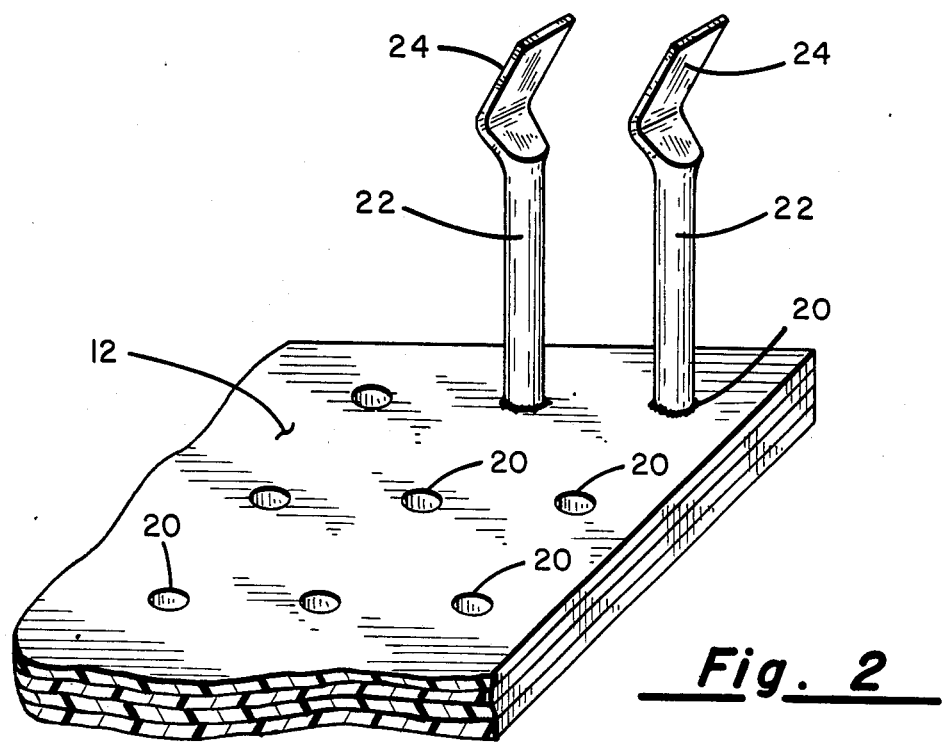
FIG. 2 is an enlarged perspective view of a portion of a printed circuit board and showing a grid pattern of plated-through holes with spring pin terminals disposed therein.
Figure 3:
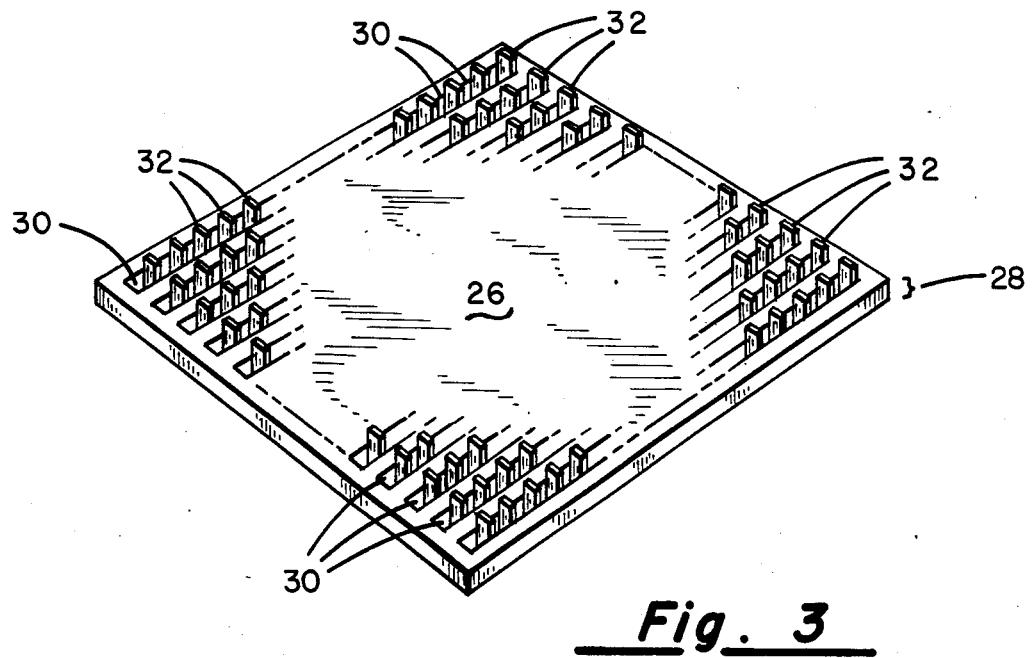
FIG. 3 is an enlarged perspective view of one-half of the connector member of the present invention.

Referring now to FIGS. 2 through 4, the zero insertion force connector of the present invention will now be explained. FIG. 2 is a greatly enlarged view of the portion of the multi-layer printed circuit board 12 over which the PGA device 18 is to be mounted. As can be seen, there is a plurality of plated-through holes 20 arranged in a grid-like pattern of rows and columns where the spacing between rows and columns corresponds to the center-to-center spacing between the terminal pins on the pin grid array. Disposed in each of the plated-through holes are a corresponding plurality of spring pin members 22 formed from a conductive material, such as, beryllium copper alloy, the pins being soldered in place and having one end thereof contacting one or more layers of printed wiring contained within the multi-layer board 12, in accordance with a prearranged wiring pattern. The exposed end of the terminal pins 22 are flattened and bowed to form leaf spring segments 24, or alternatively, the entire pin may be formed from flat stock thus obviating the flattening operation. It is readily apparent at this stage of the assembly that the integrity of the solder connections are readily viewable. Also, cleaning and conformal coating of the assembly are facilitated.

FIG. 3 shows a perspective view of one-half of the connector module and it is seen to include a rectangular or square substrate 26 which is formed from a suitable plastic in a molding operation, and formed through the thickness dimension 28 is a pattern of rectangular apertures 30 which are also aligned in a grid pattern of rows and columns whose center-to-center spacing corresponds with that of the printed circuit apertures 20 on the PC board 12 and to the spacing of the terminal pins on the PGA device 18.

Also integrally molded proximate one end of each of the rectangular apertures 30 is an outwardly projecting, generally rectangular post 32. The height dimension of the posts 32 corresponds to the thickness dimension 28 of the substrate 26. Thus, when two of the parts illustrated in FIG. 3 are superposed with respect to one another with the posts 32 of each entering the rectangular apertures 30 of the other, a clearance or opening exists between the adjacent posts because of the fact that the length dimension of the rectangular openings 30 is greater than twice the length of the rectangular posts 32. This is more readily seen in the enlarged cross-sectional view of FIG. 5a.

With no limitation intended, the thickness of the substrate may be 0.050 inches and the size of the apertures may be 0.072×0.052 inches. The posts 32 may be 0.028 inches long×0.045 inches wide. Using a 0.1 inch center to center spacing, it is possible to form a 12×12 grid on a substrate measuring 1.32×1.25 inches.

Referring next to FIG. 4, there is shown a blown-apart isometric view illustrating the manner in which the connector is used to couple the PGA device 18 to the terminal pins 22 soldered into the plated-through holes 20 on the multi-layer PC board 12. First, the superimposed connector substrates 26 and 26′ are fitted together with the posts 32 of one fitting into the apertures 30 of the other and the parts 26 and 26′ are shifted laterally with respect to one another such that the maximum opening exists between the adjacent posts. The two substrates 26 and 26′ may then be fitted over the leaf spring ends 24 of the spring pins 22 and following that, the PGA device 18 with its downwardly-depending terminal pins 34 are also fitted into the openings adjacent the leaf spring segments 24 occupying the same opening.

Figure 5A:
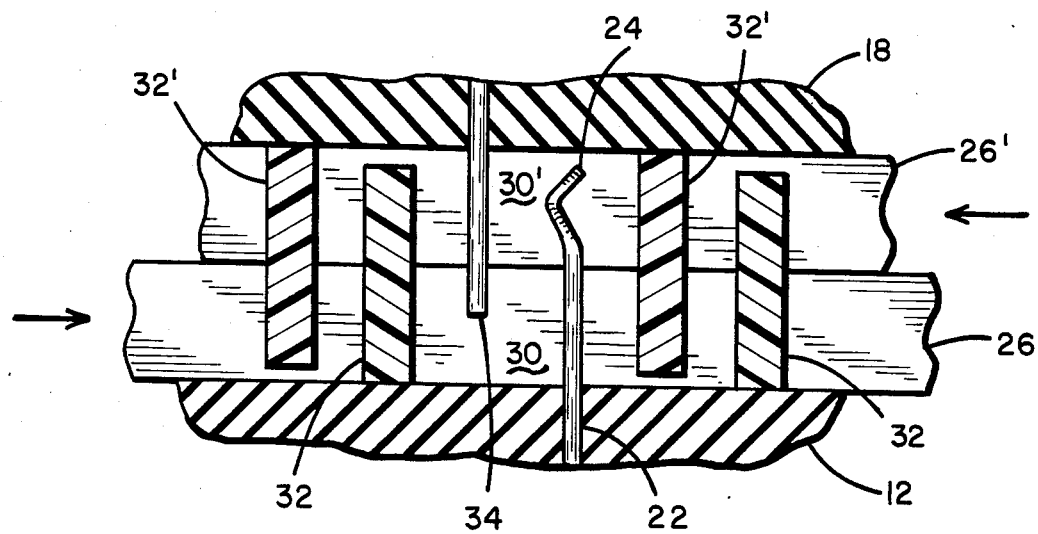
FIG. 5a is a greatly enlarged view of one contact position with the connector members unclamped.
Figure 5B:
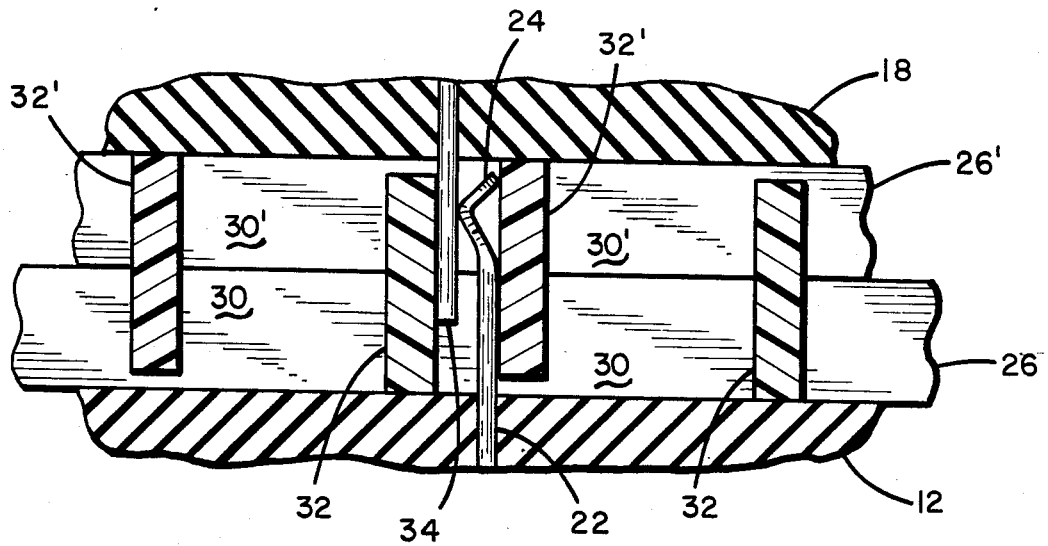
FIG. 5b is a view similar to FIG. 5a but with the connector members clamped.

Once the PGA pins 34 and the spring pins 22 have been fitted into the openings between the adjacent posts 32 in each of the apertures of the substrates 26, and 26′, as shown in FIG. 5a, a clamping arrangement is fitted about the perimeter of the substrates. With continued reference to FIG. 4, the clamping arrangement is seen to comprise a pair of side members 36 and 38 and a pair of end members 40 and 42. The side members 36 and 38 are first assembled to abut the side edges of the substrates 26 and 26′ and then the end members 40 and 42 are joined to the side members 36 and 38 by virtue of the bolts 44 passing through the end members and into threaded holes 46 formed in each end of the side members 36 and 38. As the bolts 44 are tightened, the substrates 26 and 26′ will be shifted laterally such as in the directions of the small arrows 48 and 50 which has the effect of decreasing the size of the opening into which the PGA pins 34 and the terminal spring pins 22 had previously been inserted. This has the effect of bringing the conductive pins of the PGA array into intimate electrical and mechanical contact with a mating spring pin and the squeezing force also tightly joins the PGA device 18 to the printed circuit board 12 as in clearly illustrated in FIG. 5b.

It is to be understood that the clamping arrangement depicted in the drawing of FIG. 4 is only one way of first laterally displacing the substrate members 26 and 26' and then holding them in their displaced orientation. Those skilled in the art will readily visualize alternative clamping arrangements which may be used with the molded socket substrate halves 26 and 26'.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to equipment details and operating procedures, can be accomplished without departing from the scope of the invention itself.

What is claimed is:

1. A zero insertion force connector for electrically and mechanically joining the terminal pins of pin grid array integrated circuit packages to a printed wiring board, comprising:
   (a) a plurality of spring pin contact members attached to said printed wiring board in a grid pattern of rows and columns and projecting normally from a major surface thereof;
   (b) first and second substrates formed from an insulating material and having generally rectangular apertures extending through the thickness dimension thereof, said apertures being arranged in a grid pattern of rows and columns corresponding to said grid pattern in which said plurality of spring pin contact members is arranged, each of said substrates having an integrally formed rectangular post projecting normally from a major surface thereof proximate one end of each of said rectangular apertures, each of said posts being of a height generally equal to said thickness dimension of said substrates, said first and second substrates being juxtaposed with the posts of each fitting into the rectangular apertures of the other while leaving an opening between adjacent posts, said juxtaposed substrates being positioned about said plurality of spring pin contact members and said terminal pins of said pin grid array package fitted into said apertures from opposite sides of said first and second juxtaposed substrates; and
   (c) clamp means for laterally shifting and releasably holding said posts of said first and second juxtaposed substrates against terminal pins of said pin grid array package and said plurality of spring pin contact members whereby said spring pin contact members and said terminal pins are urged together with a desired clamping force.

2. The zero insertion force connector as in claim 1 wherein said spring pin members each comprise a conductive post having one end thereof fitted into a plated-through hole in said printed wiring board and an integrally formed, arcuate segment proximate the other end thereof.

3. The zero insertion force connector as in claim 1 wherein said clamp means comprises:
   (a) a pair of parallel and spaced-apart end members and a pair of parallel and spaced-apart side members, said end and and side members positioned about the perimeter of said first and second juxtaposed substrates, the length of said side members being slightly less than the corresponding length of said first and second substrates; and
   (b) screw means for securing at least one of said end members to the ends of said pair of side members whereby, when said screw means are tightened, said end members are forced against the edges of said first and second juxtaposed substrates to laterally shift one relative to the other.

* * * * *